(12) United States Patent
Kang et al.

(10) Patent No.: US 9,478,398 B2
(45) Date of Patent: Oct. 25, 2016

(54) PLASMA BLOCK FOR REMOTE PLASMA SOURCE

(71) Applicants: New Generation Technology Co., Ltd., Gyeonggi-do (KR); J. Ocean Co., Ltd., Gyeonggi-do (KR)

(72) Inventors: Dong Won Kang, Gyeonggi-do (KR); Jung Eui Hong, Gyeonggi-do (KR); Sang Chun Baek, Gyeonggi-do (KR)

( * ) Notice: Subject to any disclaimer, the term of this patent is extended or adjusted under 35 U.S.C. 154(b) by 0 days.

(21) Appl. No.: 14/460,676

(22) Filed: Aug. 15, 2014

(65) Prior Publication Data

US 2015/0187544 A1 Jul. 2, 2015

(30) Foreign Application Priority Data

Dec. 27, 2013 (KR) ........................ 10-2013-0165925

(51) Int. Cl.
*H01J 37/32* (2006.01)

(52) U.S. Cl.
CPC ...... *H01J 37/32357* (2013.01); *H01J 37/3244* (2013.01); *H01J 37/32862* (2013.01)

(58) Field of Classification Search
CPC .................... H01J 37/32458; H01J 37/32807; H01J 37/32889; F16L 43/001
USPC .................................................... 315/111.71
See application file for complete search history.

(56) References Cited

U.S. PATENT DOCUMENTS

| 5,054,819 | A | * | 10/1991 | Grunwald | ...................... 285/179 |
| 6,830,624 | B2 | * | 12/2004 | Janakiraman et al. | ........ 118/715 |
| 2007/0227231 | A1 | * | 10/2007 | Koo | .................. H01J 37/32422 73/31.05 |
| 2010/0044580 | A1 | * | 2/2010 | Boswell | ................ H01J 27/024 250/424 |
| 2013/0118589 | A1 | * | 5/2013 | Hu | ............................ F17D 1/04 137/1 |

* cited by examiner

*Primary Examiner* — Nimeshkumar Patel
*Assistant Examiner* — Christopher Raabe
(74) *Attorney, Agent, or Firm* — Simana Rao, Esq.; NcNeely, Hare & War, LLP

(57) ABSTRACT

Provided is plasma block for a remote plasma source, and more particularly, is a plasma block that induces plasma to be generated and to flow between a remote plasma source and a vacuum chamber during a cleaning process performed on the vacuum chamber by the remote plasma source. The plasma block includes an external connection path and an internal connection path, which are formed as two sub-blocks connected to each other are combined, wherein the internal connection path includes a linear extending portion that extends in a straight line along a length direction of the internal connection path, and a curve extending portion that extends in a curve to form a curved surface based on a location where the internal connection path and the external connection path contact each other, wherein the curve extending portion has a spherical surface of a complex spherical surface.

4 Claims, 6 Drawing Sheets

PLASMA BLOCK FOR REMOTE PLASMA SOURCE

CROSS-REFERENCE TO RELATED APPLICATIONS

This application claims priority under 35 USC 119(a) to Korean Application No. 10-2013-0165925 filed on Dec. 27, 2013, the disclosure of the prior application being incorporated herein in its entirety by reference in the disclosure of this application.

BACKGROUND

1. Field

One or more embodiments of the present invention relate to a plasma block for a remote plasma source, and more particularly, to a plasma block that induces plasma to be generated and to flow between a remote plasma source and a vacuum chamber during a cleaning process performed on the vacuum chamber by the remote plasma source.

2. Description of the Related Art

Remote plasma is plasma that is generated by a plasma generator provided at a location separated from a vacuum chamber or a process chamber, or plasma that is generated and diffused in an isolated space. The remote plasma generated as such is may be led into a vacuum chamber for cleaning through a suitable guiding path. A remote plasma cleaning system or a plasma block requires a flow structure in which a cleaning gas or a fluid, such as generated plasma, efficiently flows. In detail, a plasma block for a remote plasma source, which has an internal flow path that effectively induces a fluid to flow, is required.

SUMMARY

According to one or more embodiments of the present invention, a plasma block includes an external connection path and an internal connection path, which are formed as two sub-blocks connected to each other are combined, wherein the internal connection path includes a linear extending portion that extends in a straight line along a length direction of the internal connection path, and a curve extending portion that extends in a curve to form a curved surface based on a location where the internal connection path and the external connection path contact each other, wherein the curve extending portion has a spherical surface of a complex spherical surface.

The spherical surface or the complex spherical surface of the internal connection path may have a same or longer length extending in a curve compared to a surface formed at a point where an external surface of the external connection path is bent.

5-axis machining may be performed on the spherical surface or the complex spherical surface.

A work tool for the 5-axis machining may include an insertion member that extends while having a diameter insertable through a path reaching a machining region, and a first cutter extending in a first direction and a second cutter extending in a second direction, which are formed at an end portion of the insertion member.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1A:
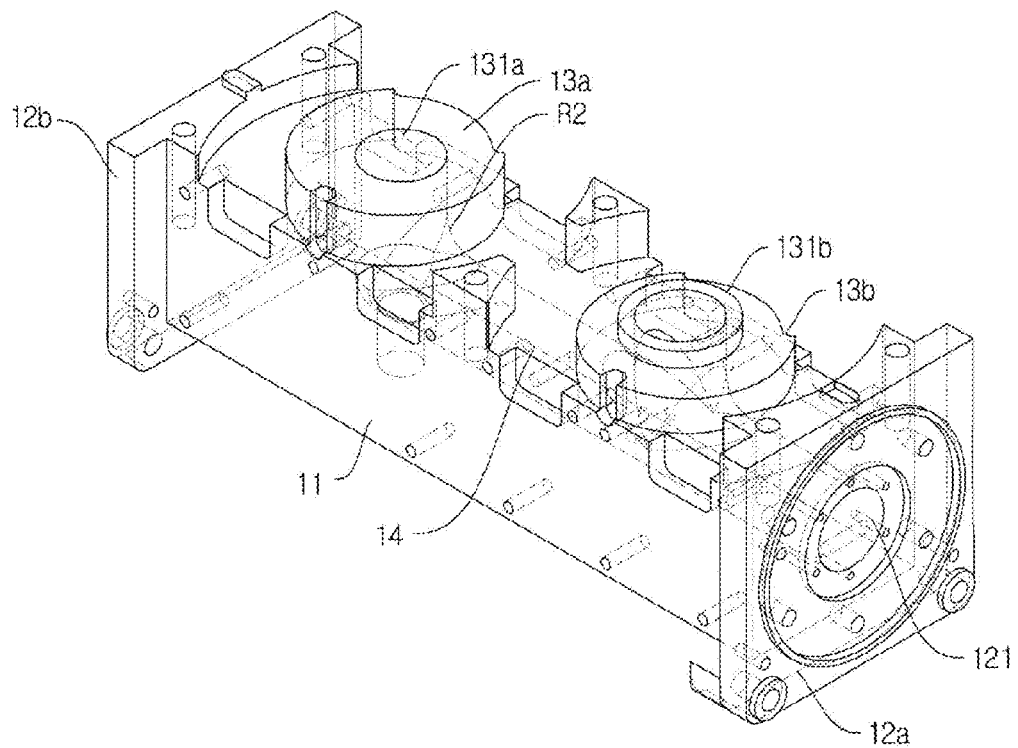
FIGS. 1A, 1B, 2A and 2B are diagrams of sub-blocks forming plasma blocks respectively according to an embodiment of the present invention and a comparative example.

Reference will now be made in detail to embodiments, examples of which are illustrated in the accompanying drawings, wherein like reference numerals refer to like elements throughout. Also, well-known components shall be simply described or shall not be described, but should not be construed as being excluded from the embodiments of the present invention. In this regard, the embodiments may have different forms and should not be construed as being limited to the descriptions set forth herein. Accordingly, the embodiments are merely described below, by referring to the figures, to explain aspects of the present description.

FIGS. 1 A, 1B, 2A and 2B are diagrams of sub-blocks 10 and 10a forming plasma blocks respectively according to an embodiment of the present invention and a comparative example.

Referring to FIGS. 1 A, 1B, 2A and 2B, the plasma block includes an external connection path 14 and internal connection paths 131a and 131b, which are formed as the two sub-blocks 10 or 10a connected to each other are combined, wherein each of the internal connection paths 131a and 131b includes a linear extending portion that extends in a straight line along a length direction of each of the internal connection paths 131a and 131b, and a curve extending portion that extends in a curve to form a curved surface based on a location where each of the internal connection paths 131a and 131b and the external connection path 14 contact each other. The curve extending portion has a spherical surface or a complex spherical surface, and the spherical is surface or the complex spherical surface of each of the internal connection paths 131a and 131b has a same or longer length extending in a curve compared to a surface formed at a point where a first surface (referring FIGS. 3A, 3B and 3C, 141), i.e., an external surface, of the external connection path 14 is bent.

The plasma block may be applied to a remote plasma source. A component such as a metal pin core, a transformer, or an electrode may be disposed in the plasma block to generate plasma. A cleaning gas including an inert gas, such as nitrogen fluoride ($NF_2$) or argon (Ar), may be put into one side of the plasma block, and plasma, such as fluoride (F), di-fluoride ($F_2$), nitrogen (N), di-nitrogen ($N_2$), or Ar in a plasma state, may be discharged from the other side of the plasma block. A process may be a deposition process, such as a chemical vapor deposition (CVD) process, but the process is not limited thereto and may be a cleaning process of any one of various semiconductor processes. A type of a cleaning gas or a plasma generating structure may be suitably determined according to a cleaning process, and is not limited to embodiments described herein.

FIGS. 1A and B are respectively a perspective view and a front view of the sub-block 10 forming the plasma block, according to an embodiment of the present invention.

The sub-block 10 may be formed of a metal, such as aluminum (Al) or Al alloy, and includes the external connection path 14 through which a cleaning gas is injected or plasma is discharged, and the internal connection paths 131a and 131b for a fluid movement between the two sub-blocks 10. The two sub-blocks 10 may be combined to form the plasma block, and by combining the two sub-blocks 10, the external connection path 14 and the internal connection paths 131a and 131b form a connected fluid transfer path.

The sub-block 10 may include a body 11 where the external connection path 14 extends, side bases 12a and 12b formed at two side surfaces of the body 11, and inlet connectors 13a and 13b that are inlets respectively for the internal connection paths 131a and 131b. Also, an insertion guide 132 may be formed at the inlet connection 13b is as occasion demands, but the insertion guide 132 is not a necessary component.

The sub-block 10 may have any one of various structures to fix a plasma generating unit, but the present invention is not limited by such structures.

Figure 1B:
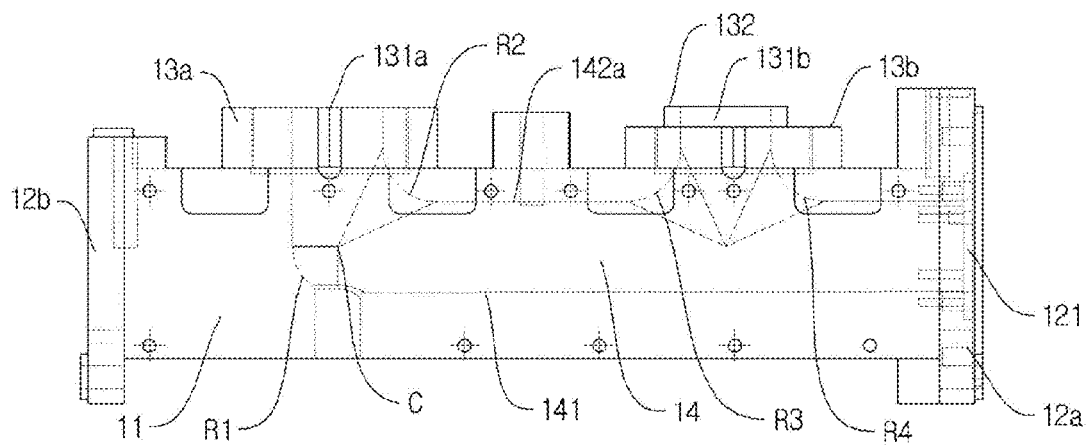

As shown in FIG. 1B, the external connection path 14 may extend from an inlet 121 of the side base 12a to have a circular cross section along the inside of the body 11, and may extend to, for example, the bottom of the inlet connector 13a. The internal connection paths 131a and 131b may respectively extend from the inlet connectors 13a and 13b to the inside of the body 11 in a cylindrical shape having a circular cross section. Also, the internal connection path 131a contacts an end portion of the external connection path 14, and the internal connection path 131b contacts a middle portion of the external connection path 14. The external connection path 14 may have the first surface 141 formed outside the body 11, and a second surface 142 contacting the internal connection paths 131a and 131b, wherein the first and second surfaces 141 and 142 may be connected to each other to form a path having a cylindrical shape. Herein, the first surface 141 may also be referred to as an external surface and the second surface 142 may also be referred to as an internal surface.

An end portion and a middle portion of the second surface 142 forming a cylindrical circumferential surface respectively contact end portions of the internal connection paths 131a and 131b having a cylindrical shape. Also, the second surface 142 is connected to the internal connection path 131a to form a path, and contacts the internal connection path 131b to form three branched paths or a T-shaped path. Also, an interface may be formed at a location where the external connection path 14 and the internal connection paths 131a and 131b contact each other.

According to an embodiment of the present invention, the interface may form spherical surfaces or complex spherical surfaces R2, R3, and R4, which may have a solid angle. For example, the interface may form a spherical surface or a complex spherical surface as a plurality of curved surfaces having different radii of curvature are combined to each other. For example, the interface may have a shape similar to a spherical surface of a convex lens that is convex inward of the external connection path 14. Alternatively, the interface may have a streamlines shape for inducing a fluid to is flow. In the streamlined shape, a curved surface shape is formed in a direction perpendicular to a flow direction so that a vortex is not generated. On the other hand, an end portion of the first surface 141 of the external connection path 14 may have the same or similar geometrical structure as the interface. Also, the end portion of the first surface 141 may materially correspond to the interface contacting the internal connection path 131a, and may have the spherical surface or the complex spherical surface R1. However, the spherical surface or the complex spherical surface R1 formed at a point where a path is bent may be a curved surface for connecting two different cylindrical shapes. The radii of curvature of the spherical surfaces or the complex spherical surfaces R1, R2, R3, and R4 may differ according to the interface, and the radii of curvature or solid angles may be determined, for example, by a portion extending in a curve from the external connection path 14 and portions extending in a curve from the internal connection paths 131a and 131b.

Centers of the radii of curvature or solid angles (In reality, a center of a spherical surface or a complex spherical surface is located outside an external connection path or an internal connection path. For convenience of description, a location in the external connection path or the internal connection path symmetrical to the center outside thereof is assumed to be a center.) may be determined, for example, by a center line of a length direction of the external connection path 14 and center lines of extension directions of the internal connection paths 131a and 131b. Also, when one path is formed in the interface, the solid angles of the spherical surfaces or the complex spherical surfaces R1 and R2 may be the same as or larger than a solid angle of an external spherical surface or an external complex spherical surface, but may vary according to structures of the external connection path 14 and the internal connection paths 131a and 131b. In detail, curve extension lengths of the spherical surfaces or the complex spherical surfaces R2, R3, and R4 formed by the second surface 142 may be the same as or higher than a curve extension length of the spherical surface or the complex spherical surface R1 formed by the first surface 141. The curve extension length denotes an extension length of a curve forming a curved surface connecting locations where curved surfaces of the internal connection paths 131a and 131b and the external connection path 14 start, and in detail, denote an extension length of a is maximum curve shape, an extension length of a minimum curve shape, or an average extension length of a curve shape, which forms a curved surface connecting two different locations.

The spherical surfaces or the complex spherical surfaces R1 through R4 are formed such that a storage space of a fluid is not formed throughout a path. Accordingly, a corner surface is not etched during a flow of plasma or a cleaning gas. Also, uniform coating is performed during a surface coating process of the external connection path 14 and the internal connection paths 131a and 131b. In addition, a uniform flow pressure is formed along a cross sectional area of the path. Moreover, an internal vortex is prevented from being generated. The radii of curvature or the solid angles of the spherical surfaces or the complex spherical surfaces R1 through R4 may be determined for such purposes.

According to an embodiment of the present invention, the spherical surfaces or the complex spherical surfaces R1 through R4 do not form surfaces formed as different cylinder tubes contact each other, but form interfaces having predetermined radii of curvature or solid angles. The solid angles of the spherical surfaces or the complex spherical surfaces R1 through R4 may increase as the curve extension lengths increase. Here, the spherical surfaces or the complex spherical surfaces R1 through R4 are not formed on all interfaces. For example, the spherical surface or the complex spherical surface R1 may be a curved surface having a radius of curvature in one direction. In other words, the spherical surface or the complex spherical surface R1 may be a smooth curved surface formed as two cylindrical shapes extending in different directions contact each other.

Figure 2A:
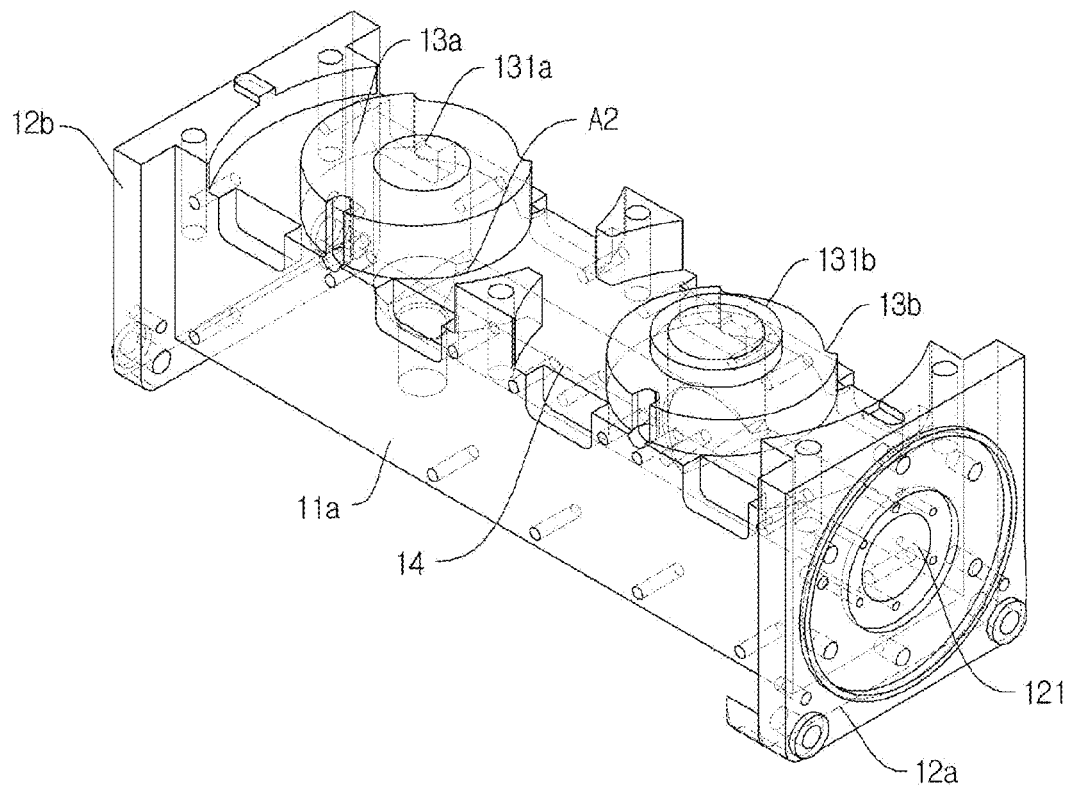
Figure 2B:
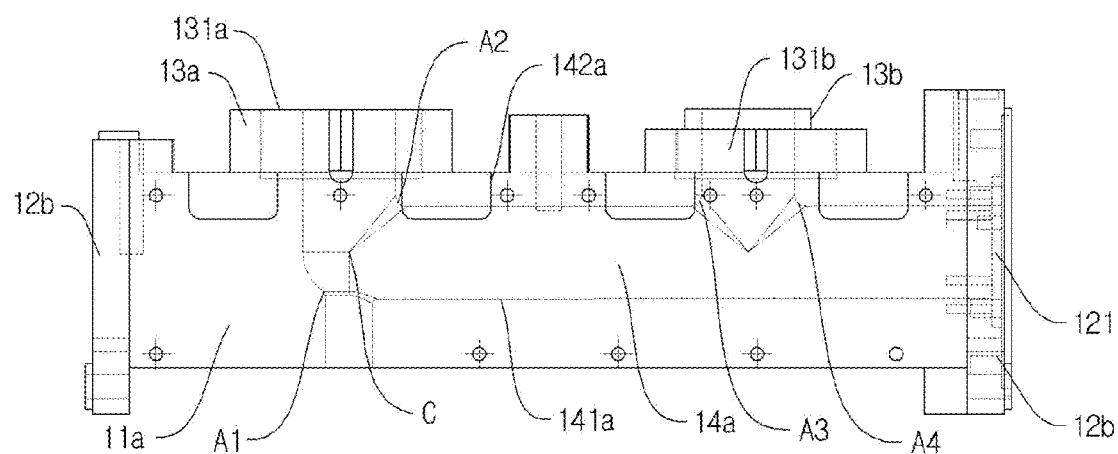

FIG. 2B is a diagram of a sub-block having joint surfaces A1 through A4 that are not spherical surfaces or complex spherical surfaces, according to an embodiment of the present invention.

Referring to 2B, each of the joint surfaces A1 through A4 may have a radius of curvature in one direction or may be a curved surface for smoothly connecting an intersection of two cylindrical shapes or two tube shapes. At this time, the joint surfaces A1 through A4 do not form a solid angle, a spherical surface, or a lens spherical surface, such as a convex lens or a concave lens.

The spherical surfaces or the complex spherical surfaces R1 through R4 may be processed via, for example, 5-axis machining, and may be formed by using a milling or cutting tool having a unique structure for forming the spherical surfaces or the complex spherical surfaces R1 through R4. For example, the spherical surfaces or the complex spherical surfaces R1 through R4 may be processed by a machining center including XYZ-axis and two rotation axes.

Hereinafter, a process of forming the spherical surfaces or the complex spherical surfaces R1 through R4, according to an embodiment of the present invention, will be described.

Figures 3A, 3B:
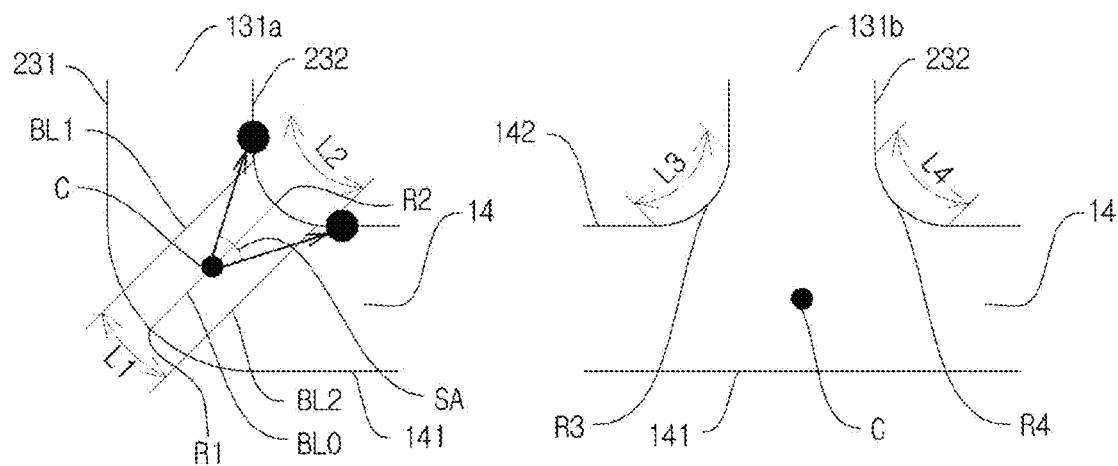
FIGS. 3A, 3B and 3C are diagrams of connection structures applicable to a sub-block forming a plasma block, according to embodiments of the present invention.
Figure 3C:
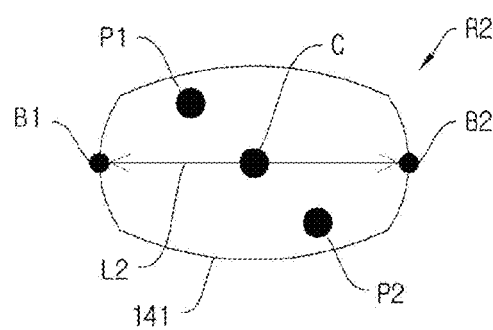

FIGS. 3A, 3B and 3C are diagrams of connection structures applicable to a sub-block forming a plasma block, according to embodiments of the present invention.

Referring to FIGS. 3A, 3B and 3C, the external connection path 14 has the first surface 141 and the second surface 142, and the internal connection paths 131a and 131b may each have a first surface 231 and a second surface 232, or only the second surface 232.

A spherical surface center C may be determined by an intersection point of a center line of the external connection path 14 and a center line of the internal connection paths 131a and 131b. Reference locations B1 and B2 where the spherical surfaces or the complex spherical surfaces R1 through R4 are formed may be determined at the interface. The reference location B1 may be set on the second surface 232 of the internal connection paths 131a and 131b, and the reference location B2 may be set on the second surface 142 of the external connection path 14. The reference locations B1 and B2 may be determined based on, for example, a surface where the first surface 141 of the external connection path 14 and the first surface 231 of the internal connection path 131a contact each other. In detail, a reference straight line BL0 reaching a center where the first surfaces 141 and 231 contact each other may be determined from the spherical surface center C. Also, when a region where the first surfaces 141 and 231 contact each other is connected in a smooth connecting minimum curve, locations contacting linear extension surfaces of the internal connection path 131a and the external connection path 14 may be determined. Then, two setting straight lines BL1 and BL2 parallel to the reference straight line BL0 may be determined is respectively from the locations. The reference locations B1 and B2 are determined on the second surfaces 232 and 142 of the internal connection path 131a and the external connection path 14 based on the setting straight lines BL1 and BL2. In detail, the reference locations B1 and B2 may be located outside the setting straight lines BL1 and BL2. The spherical surface or the complex spherical surface R2 may be determined in the similar manner. In other word, in the spherical surfaces or the complex spherical surfaces R1 through R4, curve extension lengths L2, L3, and L4 corresponding to curved surfaces formed by the second surfaces 142 of the internal connection paths 131a and 13b may be the same as or higher than a curved extension length L1 corresponding to a curved surface formed by the first surface 141. Also, as described above, the curved extension lengths L1 through L4 corresponding to the curved surfaces denote the extension length of the curve according to the curved surface connecting the locations where the curved surfaces of the internal connection paths 131a and 131b and the external connection path 14 start, and in detail, denote the extension length of the maximum curve shape, the extension length of the minimum curve shape, or the average extension length of the curve shape, which forms the curved surface connecting the two different locations. Meanwhile, a solid angle SA may be determined in the same manner. The spherical surfaces or the complex spherical surfaces R3 and R4 may be set based on the spherical surface or the complex spherical surface R2.

The reference locations B1 and B2 may be determined along extension directions and circumferential surfaces of the second surfaces 142 and 232. Accordingly, a size of the solid angle SA corresponding to the extension direction or a length direction may be different from a size of a solid angle corresponding to the circumferential surface. Thus, the spherical surface or the complex spherical surface R2 may be formed such that the circumferential surface has at least one different shapes, as shown in FIG. 3C. Also, internal surfaces P1 and P2 of the spherical surface or the complex spherical surface R2 may have different radii of curvature.

When the reference locations B1 and B2 and the radii of curvature of the internal surfaces P1 and P2 are determined, or when the radii of curvature or solid angles of the internal surfaces P1 and P2 are determined, the spherical surfaces or the complex is spherical surfaces R1 through R4 may be processed by using a milling or cutting tool in a 5-axis machining center.

However, a method of forming the spherical surfaces or the complex spherical surfaces R1 through R4 is not limited to an embodiment of the present invention, and may vary.

Hereinafter, a work tool for processing a spherical surface structure or a complex spherical surface structure, according to an embodiment of the present invention, will be described.

Figure 4A:
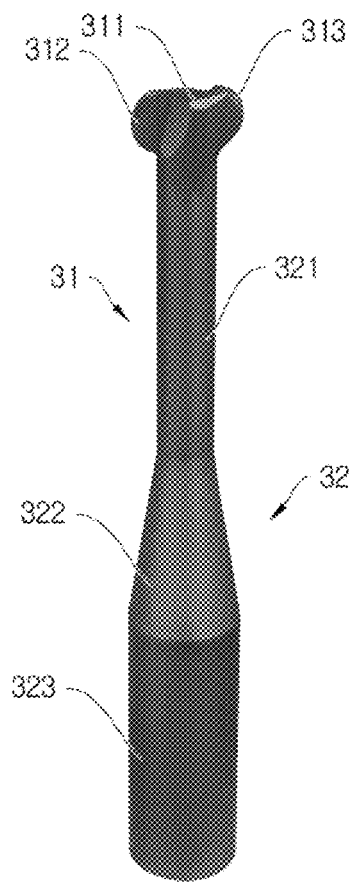
FIGS. 4A and 4B are diagrams of a work tool for manufacturing a path of a sub-block forming a plasma block, according to an embodiment of the present invention.
Figure 4B:
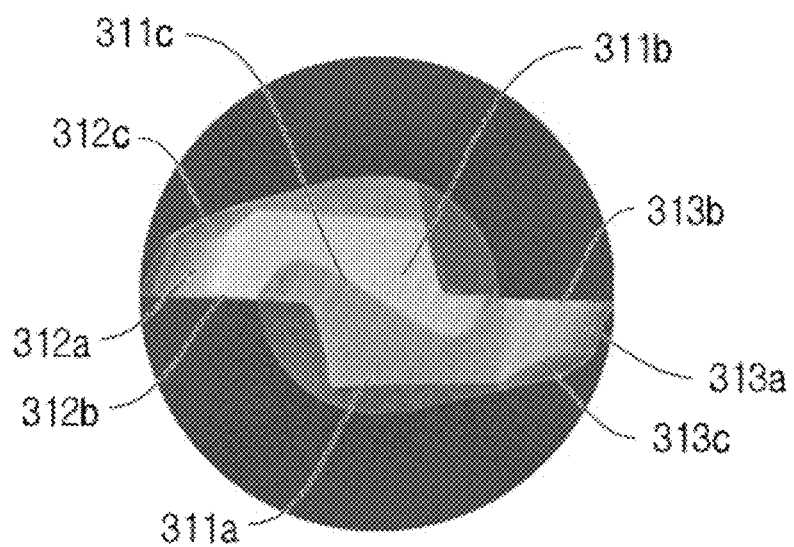

FIGS. 4A and 4B are diagrams of a work tool 30 for manufacturing a path of a sub-block forming a plasma block, according to an embodiment of the present invention.

Referring to FIGS. 4A and 4B, the work tool 30 may include an insertion member 321 that extends while having a diameter insertable through a path reaching a machining region, and a first cutter 312a extending in a first direction and a second cutter 313a extending in a second direction, which are formed at an end portion of the insertion member 321, wherein the first or second cutter 312a or 313a may include a cutting blade 312b or 313b that cuts the machining region, and a rear body 312c or 313c that forms a rear surface of the cutting blade 312b or 313b while extending by using a curved surface as a center direction.

The work tool 30 may be used to process an interface region described above, and in detail, may be used to process an internal interface region. The internal interface region may be processed by the work tool 30 according to 5-axis machining, and a curved surface structure of the internal interface region may be pre-determined.

A combining unit 32 may include a fixing member 323 that is fixed to a milling machine or a processing apparatus, and the insertion member 321 that inserts a cutter unit 31 into a path, wherein the fixing member 323 and the insertion member 321 may be connected to each other by a connection region 322. The fixing member 323 may have a certain shape that is fixable to the milling machine or the insertion member 321, and a diameter and length of the insertion member 321 may be determined based on a diameter of the path and a distance to a region to be processed. For example, the insertion member 321 may have a diameter smaller than an overall diameter of the is cutter unit 31 and a diameter of the fixing member 323, and may have a structure that extends while having a uniform diameter in a length direction. The fixing member 323, the connection region 322, and the insertion member 321 may be integrally formed or may have a detachable structure.

The cutter unit 31 may include a cutter core 311 that is formed at an end portion of the insertion member 321, a first cutter 312 that extends in a first direction from the cutter core 311, and a second cutter 313 that extends in a second direction from the cutter core 311. The first and second cutters 312 and 313 may extend in different directions or to face each other, or may have a symmetrical structure. Referring to FIG. 3B, the cutter core 311 may include a first core 311a and a second core 311b facing the first core 311a. The first and second cores 311a and 311b may contact each other at a center border line 311c. The center border line 311c may protrude upward compared to the first and second cores 311a and 311b, and thus the center border line 311c forms a crest. Accordingly, the first and second cores 311a and 311b contact each other to form a slope at the center border line 311c. Such a structure of the cutter core 311 enables the first and second cutters 312 and 313 to rotate in any one of various angles inside the path.

The first and second cutters 312 and 313 may include the cutting blades 312b and 313b that extend in a horizontal direction from the cutter core 311, and the rear bodies 312c and 313c that support the cutting blades 312b and 313b while forming a gradual hemispherical shape from end portions of the cutting blades 312b and 313b. The cutting blades 312b and 313b may have an overall processing blade shape or a processing blade shape at end portions, and the cutting blades 312b and 313b may have a semicircular shape. As such, the first and second cutters 312 and 313 may have a wing structure extending in opposite directions.

The first and second cutters 312 and 313 may have any one of various shapes to process a curved surface described above, but one or more embodiments of the present invention is not limited thereto.

The internal interface region may be processed by the work tool 30, and when an internal path and an external path are processed accordingly, a surface processing operation may be performed.

A plasma block may be formed as two sub-blocks of which the internal and external paths are processed are combined to each other.

Figure 5:
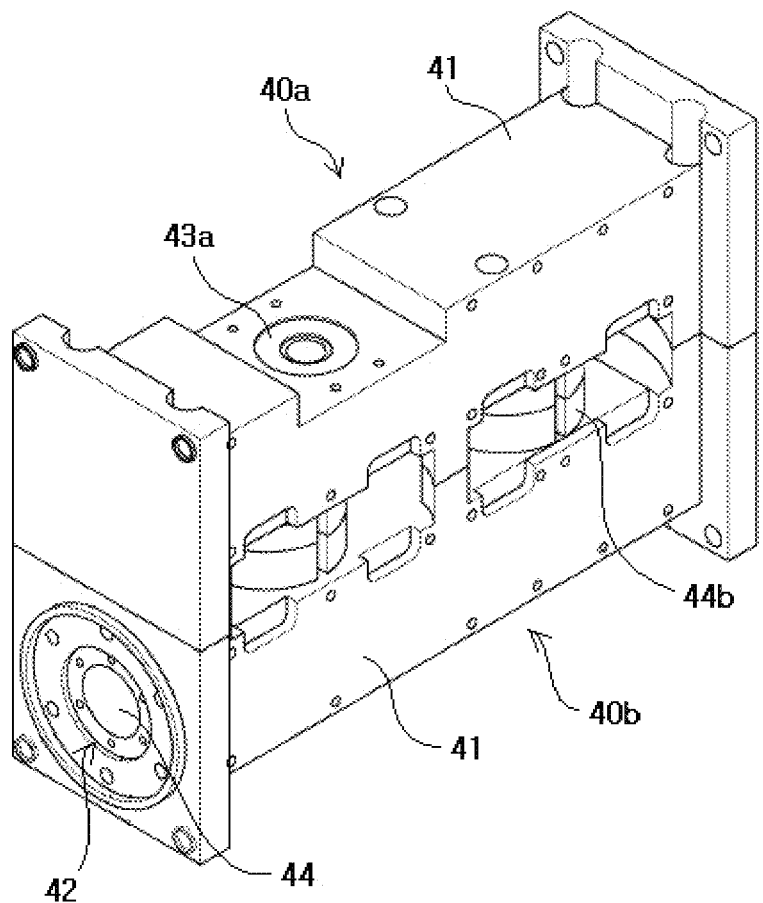
FIG. 5 is a diagram of a plasma block according to an embodiment of the present invention.

FIG. 5 is a diagram of a plasma block 40 according to an embodiment of the present invention. Referring to FIG. 5, an external connection path 42 may be formed in a body 41, wherein the external connection path 42 forms a spherical surface or a complex spherical surface by contacting end portions and middle portions of internal connection paths 33a and 33b that have extension lengths in different curve shapes and have similar cross sectional diameters. The plasma block 40 may be formed by connecting the internal connection paths 33a and 33b that are respectively formed in two sub-blocks 30a and 30b that have the same or similar structures. A cleaning gas may be injected through an inlet 42 and may change to a plasma state by a plasma generating unit (not shown). The inlet 42 may be connected to the external connection path 42 formed inside the body 41, and generated plasma may flow through the internal connection paths 33a and 33b and may be discharged to an outlet formed at the other side of the body 41 so as to be induced into a vacuum chamber.

The sub-blocks 30a and 30b may have any one of various structures, and one or more embodiments of the present invention are not limited thereto.

As described above, according to the one or more of the above embodiments of the present invention, a plasma block may improve characteristics of plasma by preventing the plasma or an injection gas from staying in a certain space. Also, the plasma block may improve a plasma generating efficiency by improving a fluid flow, while having an improved durability. In addition, the plasma block may prevent an internal corner from being etched, and at the same time, may have a uniform coating surface to prevent damage by the plasma.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A plasma block comprising an external connection path and an internal connection path, which are formed as two sub-blocks connected to each other, comprising:
   a first sub-block and a second sub-block, each comprising a body having a first side wall on one end, a second side wall on the other end, a top wall and a bottom wall, the first side wall having an opening which extends to a location within the body to form the external connection path having a substantially cylindrical shape,
   wherein the internal connection path comprises a substantially cylindrical shape and includes a first end and a second end, the internal connection path being extended in length by the juxtaposition of the first sub-block to the second sub-block such that at least one internal connection path of the first sub-block is aligned with and matable to at least one internal connection path of the second sub-block, the internal connection path comprising a linear extending portion that extends in a straight line along a length direction of the internal connection path, and a curve extending portion that extends in a curve to form a curved surface at a location where the internal connection path and the external connection path contact each other, wherein the curve extending portion has a spherical surface or a complex spherical surface.

2. The plasma block of claim 1, wherein the spherical surface or the complex spherical surface of the internal connection path has a longer length extending in a curve compared to a surface formed at a point where an external surface of the external connection path is bent.

3. The plasma block of claim 1, wherein the curve extending portion comprises an inner curved surface located proximal to the contacting surface between the first and second sub-blocks and an outer curved surface located distal to the contacting surface between the first and second sub-blocks, wherein the length of the inner curved surface is longer than the length of the outer curved surface.

4. The plasma block of claim 1, wherein the first sub-block and the second sub-block each comprise at least a first internal connection path, a second internal connection path, and an external connection path, the sub-blocks being aligned such that the first internal connection path of the first sub-block is aligned and matable with the first internal connection path of the second sub-block, and the second internal connection path of the first sub-block is aligned and matable with the second internal connection path of the second sub-block.

\* \* \* \* \*